US012772353B2

(12) United States Patent
Hampl et al.

(10) Patent No.: US 12,772,353 B2
(45) Date of Patent: Oct. 20, 2026

(54) DIMMERS WITH AN IMPROVED GATE DRIVER CIRCUIT

(71) Applicant: EATON INTELLIGENT POWER LIMITED, Dublin (IE)

(72) Inventors: Martin Hampl, Mohelnice (CZ); Justin Franke, Sharpsburg, GA (US); Hoon Lee, Sugar Hill, GA (US); Nilesh Kadam, Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 40 days.

(21) Appl. No.: 18/936,301

(22) Filed: Nov. 4, 2024

(65) Prior Publication Data

US 2025/0151184 A1 May 8, 2025

Related U.S. Application Data

(60) Provisional application No. 63/547,791, filed on Nov. 8, 2023.

(51) Int. Cl.

*H05B 45/31* (2020.01)
*H03K 17/687* (2006.01)
*H05B 45/10* (2020.01)
*H05B 47/24* (2020.01)

(52) U.S. Cl.

CPC ........... *H05B 45/31* (2020.01); *H03K 17/687* (2013.01); *H05B 45/10* (2020.01); *H05B 47/24* (2020.01)

(58) Field of Classification Search

CPC ........ H05B 47/24; H05B 45/10; H05B 45/31; H03K 17/687

See application file for complete search history.

(56) References Cited

U.S. PATENT DOCUMENTS

| | | | | |
|---|---|---|---|---|
| 5,422,547 | A * | 6/1995 | Brownell | H05B 41/3924 315/307 |
| 6,421,260 | B1 * | 7/2002 | Trevino | H02M 7/53871 363/98 |
| 10,530,268 | B2 | 1/2020 | Newman, Jr. et al. | |
| 2009/0200952 | A1 * | 8/2009 | King | H05B 41/3924 315/206 |
| 2014/0126261 | A1 * | 5/2014 | Newman, Jr. | H05B 39/04 363/128 |
| 2021/0367502 | A1 | 11/2021 | Yokum et al. | |

* cited by examiner

*Primary Examiner* — Patrick C Chen

(74) *Attorney, Agent, or Firm* — Eckert Seamans Cherin & Mellott, LLC

(57) ABSTRACT

A dimmer includes a TRIAC structured to conduct load current during an on phase and not conduct the load current during an off phase; a snubber circuit including a resistor and a capacitor electrically connected to the resistor at a node; and a bidirectional switch structured to transmit a gate current pulse to gate of the TRIAC to switch the TRIAC between the OFF phase and the ON phase, the bidirectional switch including a first MOSFET, a second MOSFET, a first resistor electrically connected to source of the first MOSFET and a second resistor electrically connected to source of the second MOSFET, drain of the first MOSFET being electrically connected to the node of the snubber circuit, and drain of the second MOSFET being electrically connected to the gate of the TRIAC.

19 Claims, 6 Drawing Sheets

DIMMERS WITH AN IMPROVED GATE DRIVER CIRCUIT

CROSS REFERENCE TO RELATED APPLICATIONS

This application claims priority to U.S. Patent Application Ser. No. 63/547,791, filed Nov. 8, 2023, entitled DIMMERS WITH AN IMPROVED GATE DRIVER CIRCUIT, which is incorporated herein in its entirety.

FIELD OF THE INVENTION

The disclosed concept relates generally to dimmers, and in particular TRIAC-based dimmers with an improved gate driver circuit.

BACKGROUND OF THE INVENTION

Dimmers provide a dimming function for loads such as lights. Dimmers are generally placed between a power source and the loads and control the nature of the power provided to the loads. Very simple dimmers regulate the voltage provided to the loads by, for example, dividing the voltage using a variable resistor. More recent dimmers cut off a part of each half-cycle of the power provided to the loads. In some dimmers, the cut off is from a zero crossing in the power until a predetermined time after the zero crossing. Cutting off a part of the waveform can be accomplished using a bidirectional switch such as a TRIAC (triode for alternating current). A TRIAC has two phases: an ON phase during which the TRIAC is conducting load current and an OFF phase during which the TRIAC is not conducting the load current. As shown in FIG. 1, conventional TRIAC-based dimmers 10 switch a TRIAC 14 between the ON phase and the OFF phase by driving a gate of the TRIAC 14 via a bidirectional switch 100. The dimmers 10 also include a snubber circuit 15 structured to limit fast voltage transients (particularly, during TRIAC switching). The snubber circuit 15 includes a resistor 15B (having a value of, e.g., without limitation, 150Ω) and a capacitor 15C (having a value of, e.g., without limitation, 150 nF) electrically connected to the resistor 15B at a node 15A. The snubber circuit 15 is coupled to the line conductor 2, the TRIAC 14, and the loads 4.

The bidirectional switch 100 is structured to transmit a gate current pulse signal to the gate of the TRIAC 14 to switch the TRIAC 14 between the ON phase and the OFF phase. The gate current pulse signal must satisfy basic criteria including: current level above a trigger current value and below the peak current limit; pulse width longer than datasheet specified turn-on time; and slow falling edge of the pulse. Conventional dimmers often operate the bidirectional switches in quadrants II and III of the TRIACS, which typically have differences in a number of critical parameters (e.g., trigger current and latching current). The dimmers 10 operate the bidirectional switch 100 in quadrants I and III of the TRIAC 14, which typically have the same or similar critical parameters. The bidirectional switch 100 may be, e.g., without limitation, an optotriac, antiseries connection of MOSFETs, etc. As shown in FIG. 2, the bidirectional switch 100 of the dimmers 10 includes two MOSFETs 102,104 connected to each other and a power supply and a control circuit (not shown) at their sources. Drain of the MOSFET 102 is electrically connected in series at one end of resistor 106 (having a value of, e.g., without limitation, 100Ω) in order to limit line current inputted to the gate of the TRIAC 14. Nevertheless, the drain of the MOSFET 102 remains coupled to the line conductor, rendering the gate current to the TRIAC dependent on the line voltage, which can vary significantly depending on what the actual line voltage is when the TRIAC 14 is turned ON. Resistor 108 (having a value of, e.g., without limitation, 100Ω) is electrically connected to the gate and main terminal 1 (MT1) of the TRIAC 14 in order to improve electromagnetic compatibility (EMC), especially the immunity. However, regardless of which quadrants are being used, the conventional TRIAC-based dimmers do not have an effective gate current pulse control, resulting in potentially unreliable switching performance and shortened lifespan of the TRIAC.

Such unreliable switching performance can be described with reference to FIG. 5, which illustrates gate current pulse 21 for switching the TRIAC 14. In FIG. 5, signal 22 is control voltage to the MOSFETs 102,104, signal 23 is voltage across the TRIAC 14, and signal 24 is main current flowing through the TRIAC 14. Initially, the TRIAC 14 and the MOSFETs 102, 104 are turned OFF as shown by the main current 24 and the control voltage 22 both being at 0. At time t1, the MOSFETs 102,104 are switched ON as shown by a rising edge of the control voltage 22, and the current flows through the MOSFETs 102, 104 to the gate of the TRIAC 14 as shown by a rising edge of the gate current pulse 21. The TRIAC 14 starts to be turned ON by the gate current pulse at time t1. However, the gate is immediately switched OFF at the start of turning ON of the TRIAC 14 because all the current now flows to the TRIAC 14 as shown by a steep falling edge of the gate current pulse 21 and a rising of the current 24 between time t1 to t2. This immediate switching OFF of the gate can be problematic. For example, if there is a perturbation when the TRIAC 14 is turned ON, the perturbation may cause the TRIAC 14 to immediately commutate back OFF because there is no current to the gate of the TRIAC 14.

There is room for improvement in driving the gate of the TRIAC for dimmers.

There is a need for a gate current pulse control for the TRIAC in TRIAC-based dimmers.

SUMMARY OF THE INVENTION

These needs, and others, are met by embodiments of the disclosed concept in which a dimmer for lighting is provided. The dimmer is structured to be placed between a power source and a load. It includes: a TRIAC (triode alternating current) having a gate, a first terminal electrically connected to the load, and a second terminal electrically connected to the power source, wherein the TRIAC is structured to conduct load current during an on phase and not conduct the load current during an off phase; a snubber circuit including a third resistor and a capacitor electrically connected to the third resistor at a node, the third resistor being electrically connected to the power source at one end opposite the node, the capacitor being electrically connected to the first terminal of the TRIAC at one end opposite the node, wherein the snubber circuit is structured to limit fast voltage transients; and a bidirectional switch including a first MOSFET (metal-oxide-semiconductor field-effect transistor) having drain that is electrically connected to the node of the snubber circuit, a second MOSFET having drain that is electrically connected to the gate of the TRIAC, a first resistor electrically connected to source of the first MOSFET, and a second resistor electrically connected to the first resistor at one end and source of the second MOSFET at another end, wherein the bidirectional switch is structured to transmit a gate current pulse signal to the gate of the TRIAC to switch the TRIAC between the OFF phase and the ON phase.

Another exemplary embodiment provides a bidirectional switch for use in a dimmer structured to be placed between a power source and a load. The dimmer has a snubber circuit including a resistor and a capacitor connected to each other at a node, and a TRIAC including a gate, first terminal structured to be connected to the load and the capacitor, and second terminal structured to be connected to the power source. The bidirectional switch includes a first MOSFET having drain that is structured to be directly connected to the node of the snubber circuit, a first resistor having first and second ends, the first end structured to be electrically connected to source of the first MOSFET, a second resistor having third and fourth ends, the third end structured to be electrically connected to the first end of the first resistor, and a second MOSFET having source that is structured to be electrically connected to the fourth end of the second resistor and drain that is structured to be electrically connected to the gate of the TRIAC, wherein the bidirectional switch is structured to transmit a gate current pulse signal to the gate of the TRIAC to switch the TRIAC between the OFF phase and the ON phase.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
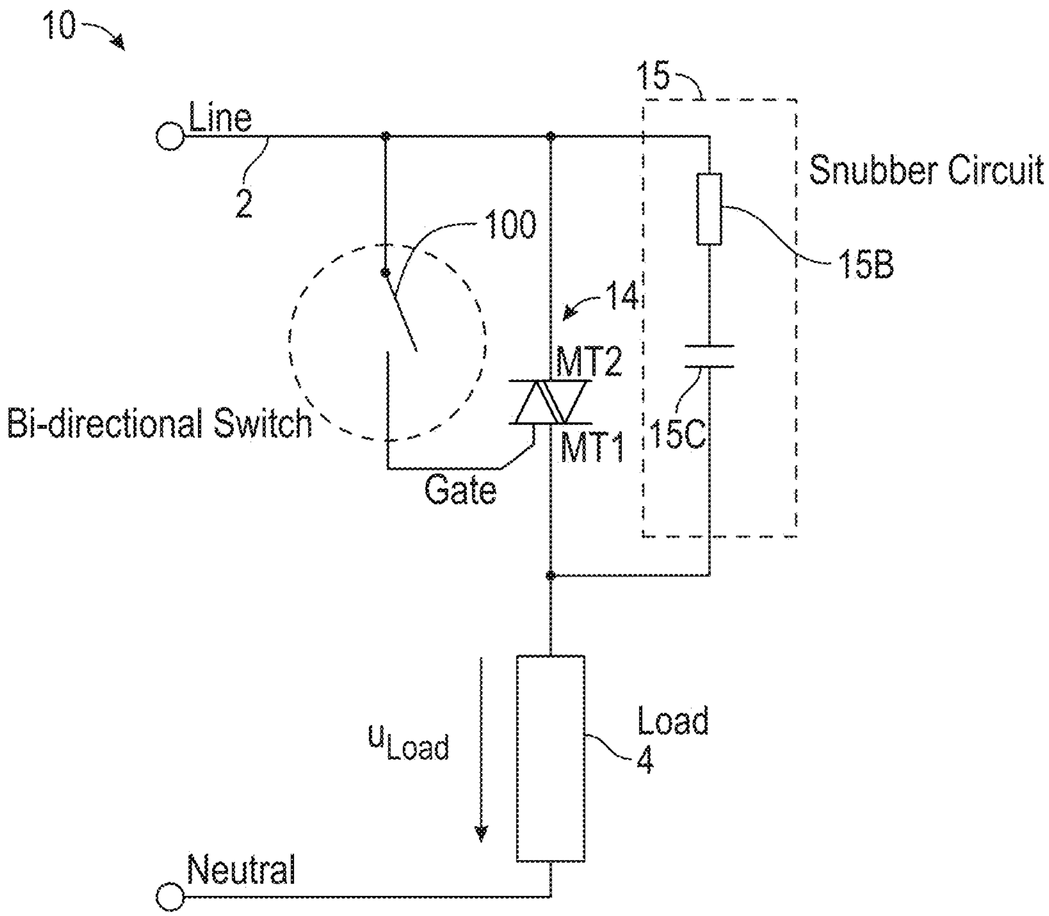
FIG. 1 is a partial schematic of a conventional dimmer with a bidirectional switch for TRIAC control.
Figure 2:
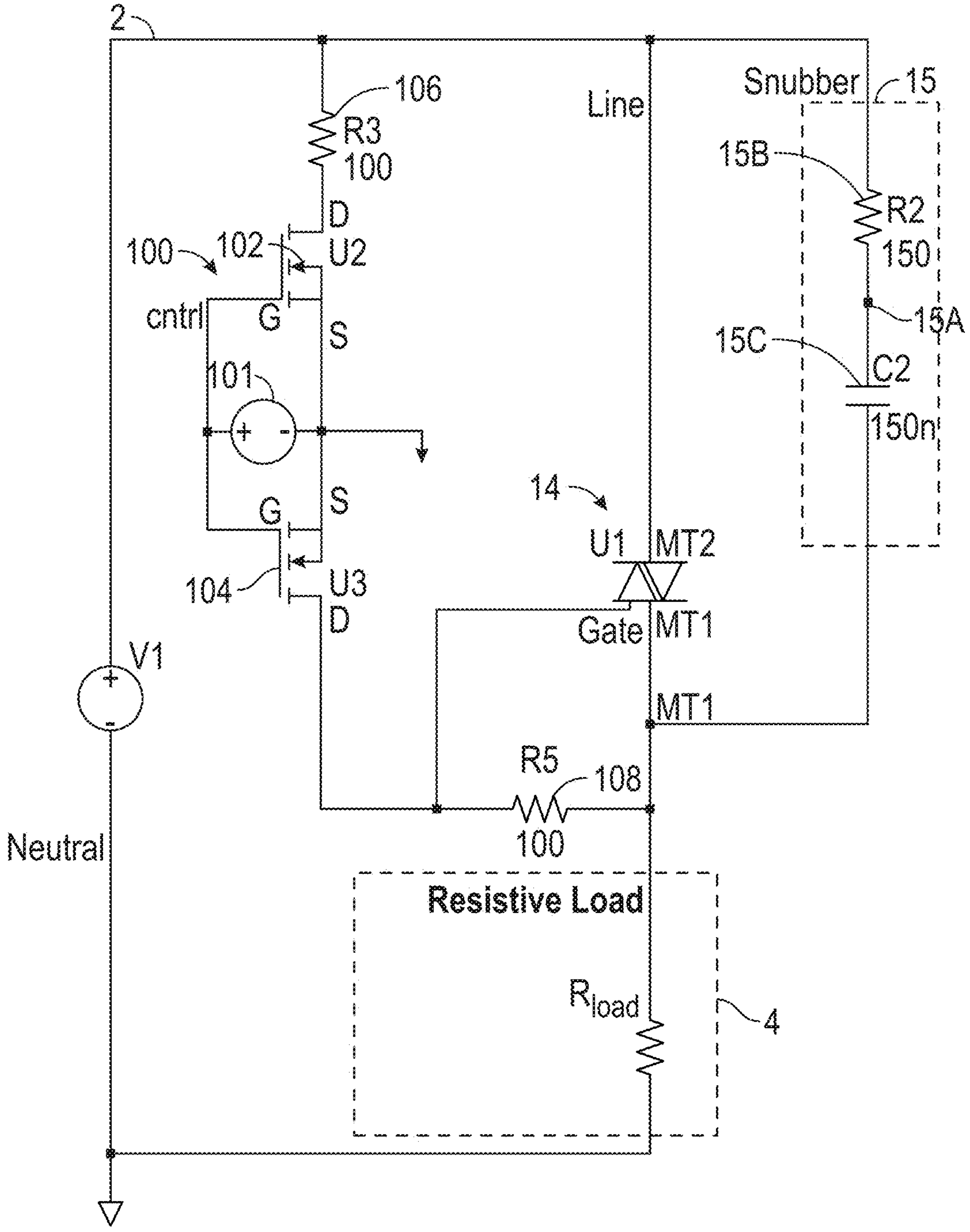
FIG. 2 is a partial schematic of the conventional dimmer of FIG. 1.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Example embodiments of the disclosed concepts provide a TRIAC-based dimmer with a gate driver circuit structured to control an amplitude, duration and edge rate of a gate current pulse. Specifically, the gate driver circuit is structured to limit the amplitude, reduce a falling edge rate and extend the duration (width) of the gate current pulse. The gate driver circuit includes a bidirectional switch having two MOSFETs and two resistors each electrically coupled to the sources of the MOSFETs, thereby providing constant current to the gate of the TRIAC until the TRIAC is fully turned ON and preventing accidental turning OFF of the TRIAC. For example, the duration of the gate current pulse (50% of peak level) using the gate driver circuit of the disclosed concept is, e.g., without limitation, approximately 38 μs while the duration of the same using the conventional bidirectional switch is approximately 3.3 μs. Further, the drain of the MOSFET, which would have been directly coupled to the line conductor in the conventional dimmers, is electrically connected to a node that connects a snubber resistor and a snubber capacitor within the snubber circuit, thereby providing a current source to the gate of the TRIAC that is independent of line voltage that varies significantly based on the actual voltage upon turning ON the TRIAC. Further, peak current to the gate of the TRIAC is smaller than the peak current to the gate of the TRIAC in the conventional dimmers, thereby providing lower stress for the TRIAC and increasing the reliability of the TRIAC. In addition, the current to the gate is not stopped by turning ON the TRIAC as is the case in the conventional dimmers. That is, the decrease of the gate current pulse is slower than that of the gate current pulse of the conventional dimmers, thereby assisting with latch ON of the TRIAC.

Figure 3:
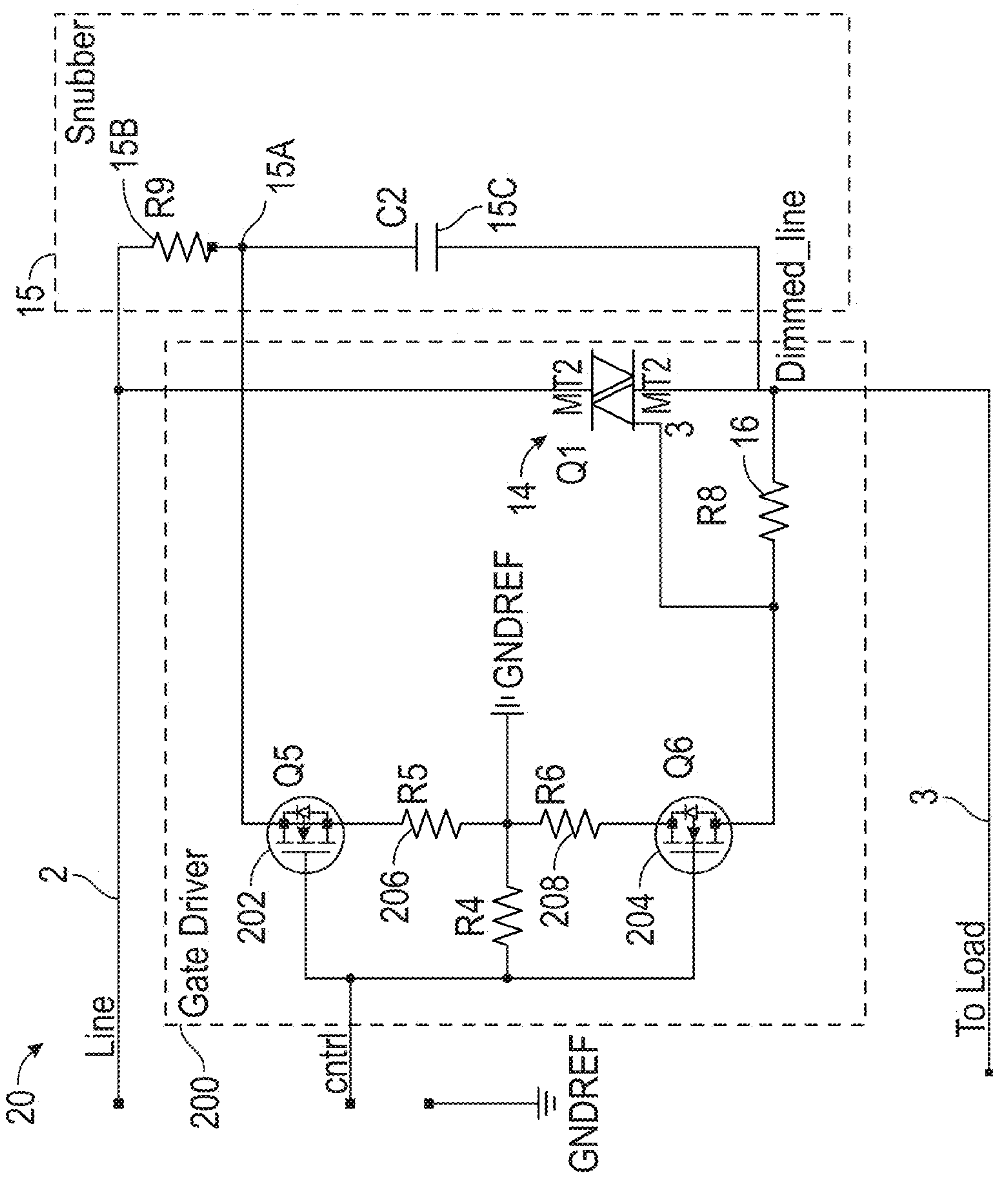
FIG. 3 is a partial schematic of an exemplary dimmer with an improved gate control circuit according to a non-limiting, example embodiment of the disclosed concept.
Figure 4:
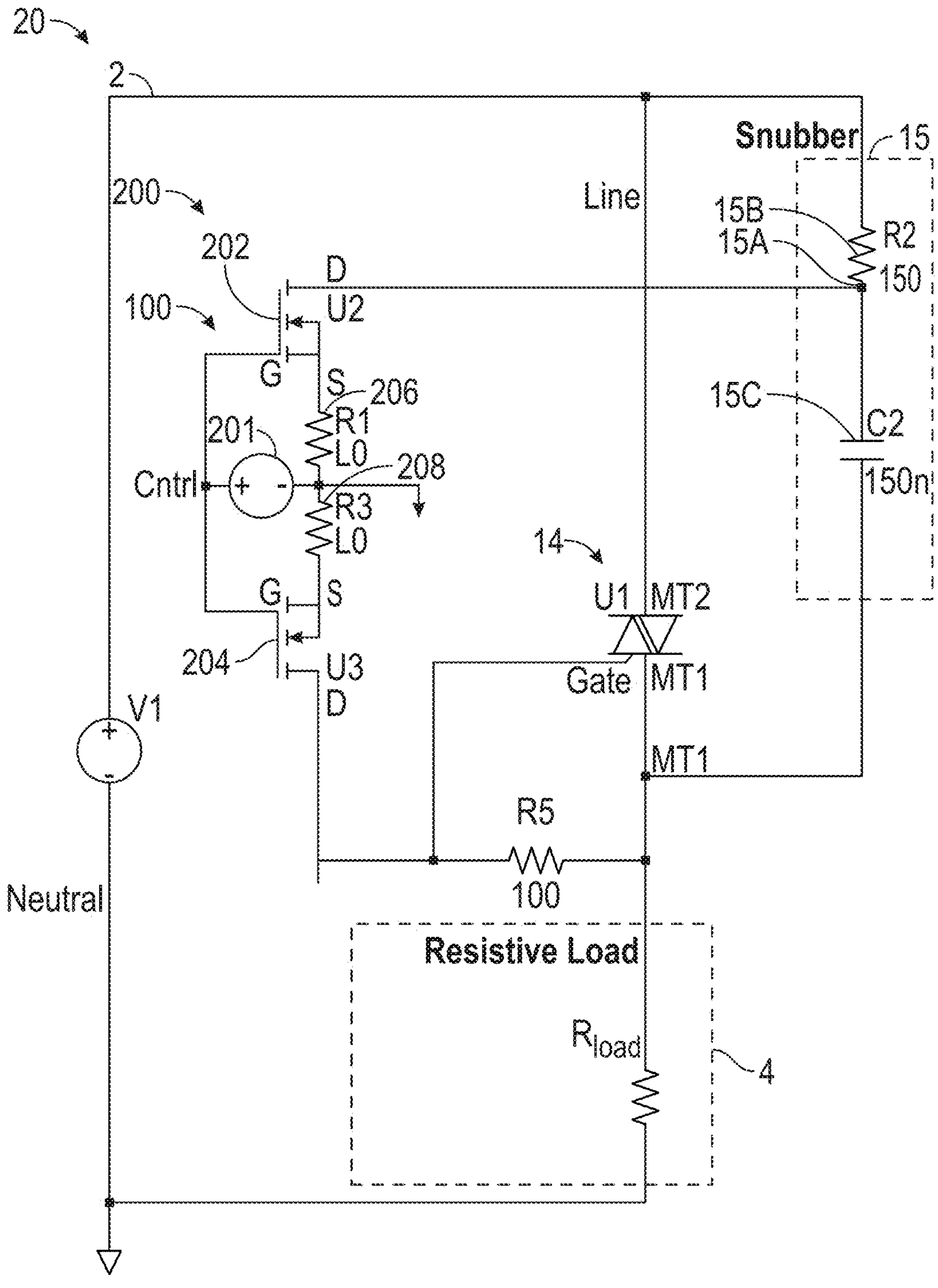
FIG. 4 is a partial schematic of the exemplary dimmer with an improved gate control circuit according to a non-limiting, example embodiment of the disclosed concept.
Figure 6:
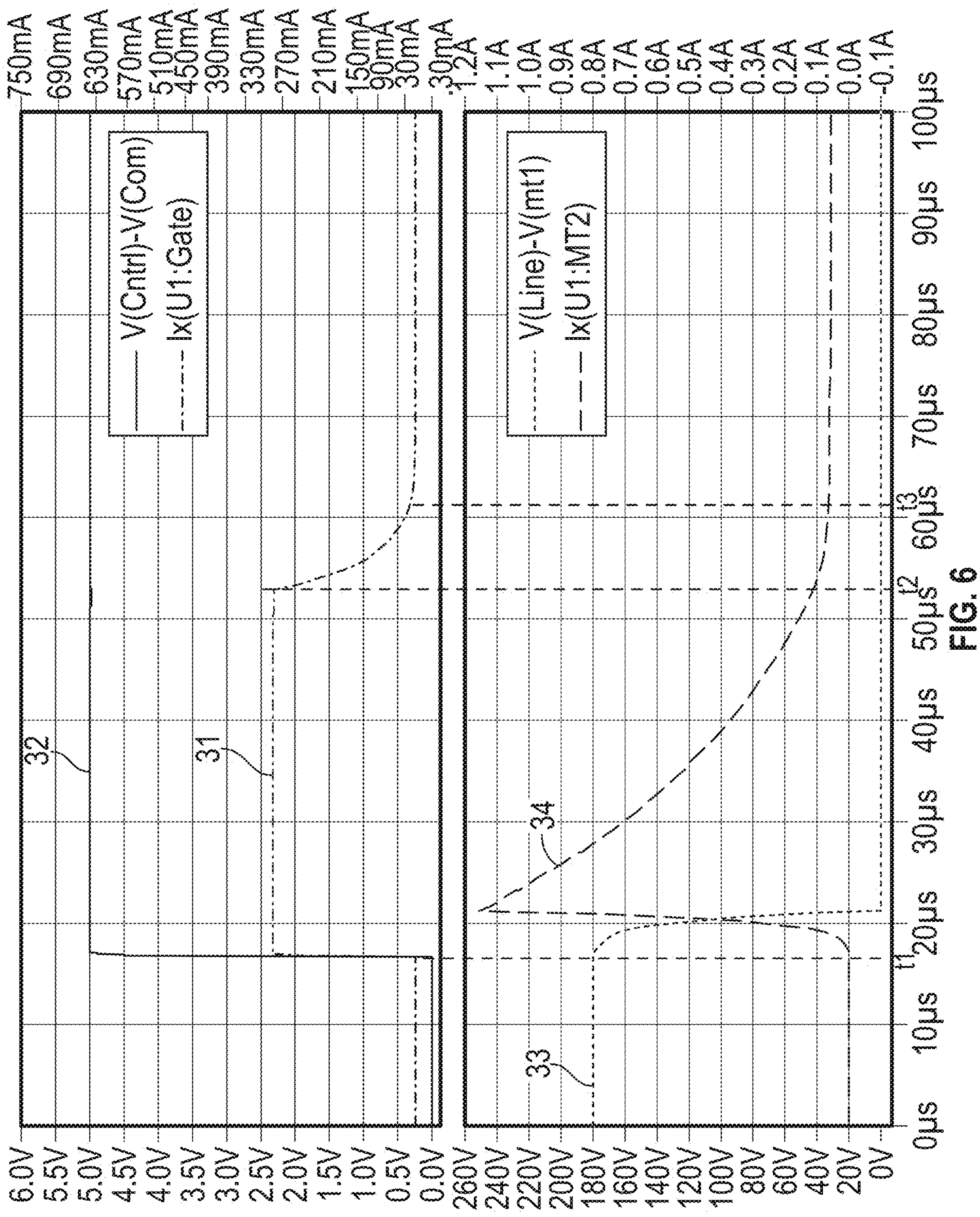
FIG. 6 illustrates a gate current pulse of the exemplary dimmer with an improved gate control circuit according to a non-limiting, example embodiment of the disclosed concept.

FIGS. 3 and 4 are partial schematics of a dimmer 20 with a gate driver circuit 200 according to a non-limiting, example embodiment of the disclosed concept. The dimmer 20 is similar to the TRIAC-based dimmers 10 of FIG. 1, except in that the dimmer 20 includes the inventive gate driver circuit 200. As such, any overlapping descriptions of the similar components and features thereof is omitted for the sake of brevity. The gate driver circuit 200 includes a bidirectional switch having two MOSFETs 202,204 and two resistors 206,208 (each having a value of, e.g., without limitation, 10Ω). The MOSFETs 202,204 are connected to a power supply 201 and a control circuit (not shown) structured to cause the MOSFETs 202,204 to be turned ON and OFF. The drain of the MOSFET 202 is directly connected to the node 15A of the snubber circuit 15, and not connected to a line conductor coupled to the power source. The drain of the MOSFET 204 is connected to the gate of the TRIAC 14. Resistor 206 is electrically connected to the source of MOSFET 202 and resistor 208 is electrically connected to the source of MOSFET 204. Resistors 206,208 are structured to limit the current flowing to the gate of the TRIAC 14 upon turning ON the MOSFETs 202,204. By connecting the resistors 206,208 to sources of the MOSFETs 202,204, the gate current is determined only by parameters of the MOSFETs 202,204 and values of the resistors 206,208, thereby allowing the gate current to have controlled peak independent of the line voltage. Having a controlled peak helps with maximizing the lifespan of the TRIAC 14. Further, connecting the drain of MOSFET 202 to the node 15A of the snubber circuit 15 allows current to flow to the gate from capacitor 15C upon turning ON the MOSFETs 202,204. The current continues to flow to the gate until the capacitor 15C is discharged. The capacitor 15C may be discharged not only through the MOSFETs 202,204, but also in parallel through resistor 15B and TRIAC 14. Thus, the values of the capacitor 15C and resistor 15B are designed with respect to the required gate current pulse duration. As such, the gate current is not stopped immediately at the initiation of turning ON of the TRIAC 14 as it is in the conventional dimmer 10. With the capacitor 15C acting as an energy source that provides current to the gate of the TRIAC 14 during the switching ON of the TRIAC 14, the controlled peak of the gate current pulse can last for a period, e.g., without limitation, 38 μs (as shown in FIG. 6) to maintain the gate driving of the TRIAC 14 until the TRIAC 14 is fully switched ON, thereby preventing unwanted accidental turning OFF of the TRIAC 14 due to transient noises or perturbation upon switching. As such, the gate driver circuit 200 enables the TRIAC 14 to perform switching operations more effectively and reliably than the TRIAC 14 of the conventional dimmers 10 does. These advantages of the gate driver circuit 200 can be explained in further detail with reference to the gate current pulse 31 of the gate driver circuit 200 as illustrated in FIG. 6.

Figure 5:
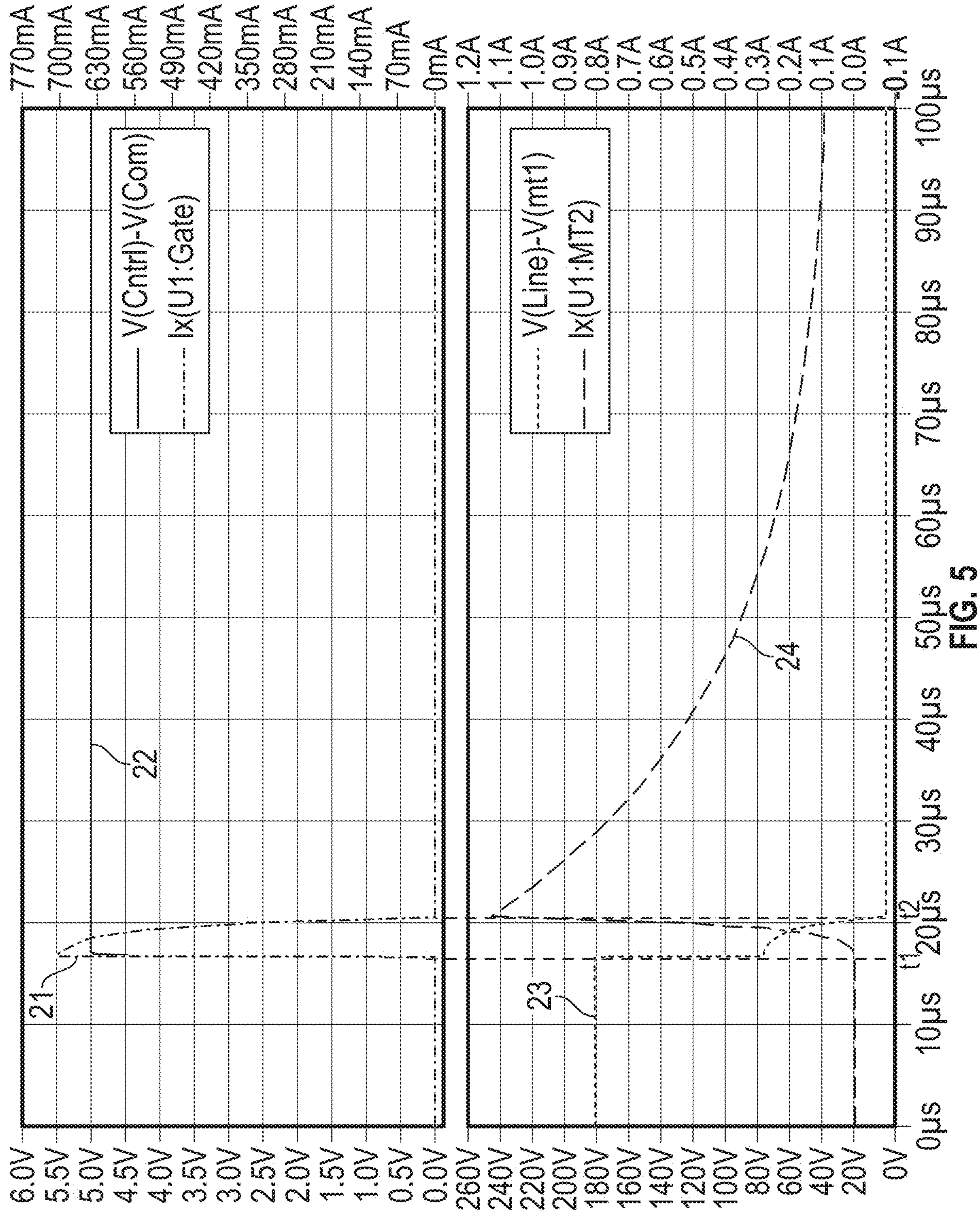
FIG. 5 illustrates a gate current pulse of the conventional dimmer of FIG. 1.

FIG. 6 illustrates the gate current pulse 31 of the gate driver circuit 200 of the dimmers 20 according to a non-limiting, example embodiment of the disclosed concept. In FIG. 6, signal 32 is control voltage to the MOSFETs 102,104, signal 33 is voltage across the TRIAC 14, and signal 34 is main current flowing through the TRIAC 14. Initially, the TRIAC 14 and the MOSFETs 102, 104 are turned OFF as shown by the main current 34 and control voltage 32. At time t1, the MOSFETs 102,104 are switched ON as shown by a rising edge of the control voltage 32, and the current flows through the MOSFETs 102, 104 to the gate of the TRIAC 14 as shown by a rising edge of the gate current pulse 31. The TRIAC 14 is turned ON by the gate current pulse at time t1 and the voltage 33 across the TRIAC 14 falls down to zero shortly after time t1. While the main current 34 reaches its maximum and reduces to nearly zero, e.g., without limitation, about 0.1 A, the gate current 31 continues to flow from the capacitor 15C until the capacitor 15C is discharged at time t3. As compared to the gate current pulse 31 of the conventional dimmers 10 as shown in FIG. 5, FIG. 6 shows that the gate driver circuit 200 provides significant improvements in the amplitude, the duration and the edge rates of the gate current pulse. For example, the amplitude of the gate current pulse 31 remains controlled and constant at, e.g., without limitation, about 290 mA for a period from time t1 to t2 lasting, e.g., without limitation, 38 μs whereas the gate current pulse 21 of the conventional dimmers 10 immediately (e.g., without limitation, within 3.3 μs) goes to 0 A. As such, upon turning ON the MOSFETs 202,204, the gate current pulse rises to a peak and remains constant during switching ON of the TRIAC 14. Hence, the gate current pulse 31 has controlled peak for a longer period than that of the conventional dimmers 10 does. Such controlled and constant peak not only prevents unwanted accidental turning OFF of the TRIAC 14, but also assists with maximizing the lifespan of the TRIAC 14. Further, the duration of the gate current pulse 31 lasts, e.g., without limitation, about 45-60 μs as measured from time t1 to t3, thereby extending gate driver capability significantly longer than the immediate stopping of the gate current at initiation of turning ON of the TRIAC 14 in the conventional dimmers 10 as shown in FIG. 5. In addition, the gate current pulse 31 has a slower falling edge from time t2 to t3 as compared to the precipitous falling edge to 0 A within 3.3 μs in the conventional dimmers 10. Having a slower falling edge of the gate current pulse assists with avoiding unwanted accidental latching.

Therefore, by simply adding two resistors at the sources of the MOSFETs 202,204 and connecting the drain of the MOSFET 202 to a node connecting the resistor 15B and the capacitor 15C of the snubber circuit 15, rather than directly to the line conductor 2 as in the conventional dimmers 10, the gate driver circuit 200 of the dimmers 20 of the disclosed concept effectively controls the amplitude, duration, and edge rates of the gate current pulse, thereby improving consistency and robustness of switching performance and lifespan of the TRIAC 14.

Optionally, the bidirectional switch 200 may include resistor 16 electrically connected between the gate of the TRIAC 14 and the main terminal 1 (MT1) of the TRIAC 14. The resistor 16 is structured to increase immunity against false triggering of the TRIAC 14.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A dimmer structured to be placed between a power source and a load, comprising:

a TRIAC (triode alternating current) having a gate, a first terminal electrically connected to the load, and a second terminal electrically connected to the power source, wherein the TRIAC is structured to conduct load current during an ON phase and not conduct the load current during an OFF phase;

a snubber circuit including a third resistor and a capacitor electrically connected to the third resistor at a node, the third resistor being electrically connected to the power source at one end opposite the node, the capacitor being electrically connected to the first terminal of the TRIAC at one end opposite the node, wherein the snubber circuit is structured to limit fast voltage transients; and a bidirectional switch including a first MOSFET (metal-oxide-semiconductor field-effect transistor) having drain that is electrically connected to the node of the snubber circuit, a second MOSFET having drain that is electrically connected to the gate of the TRIAC, a first resistor electrically connected to source of the first MOSFET, and a second resistor electrically connected to the first resistor at one end and source of the second MOSFET at another end, wherein the bidirectional switch is structured to transmit a gate current pulse signal to the gate of the TRIAC to switch the TRIAC between the OFF phase and the ON phase, wherein the gate current is determined only by parameters of the first and second MOSFETs and values of the first and second resistors.

2. The dimmer of claim 1, wherein the drain of the first MOSFET is directly connected to the node of the snubber circuit and is not electrically connected to a line conductor coupled to the power source.

3. The dimmer of claim 1, wherein upon turning ON the first MOSFET and the second MOSFET, current flows to the gate of the TRIAC from the capacitor of the snubber circuit via the first MOSFET and the second MOSFET.

4. The dimmer of claim 1, wherein the first resistor and the second resistor are structured to limit the current flowing to the gate of the TRIAC upon turning ON the first MOSFET and the second MOSFET.

5. The dimmer of claim 1, wherein the capacitor acts as an energy source to the TRIAC during the switching ON of the TRIAC.

6. The dimmer of claim 1, wherein upon turning ON the first MOSFET and the second MOSFET, gate current pulse rises to a peak and remains constant during switching ON of the TRIAC such that unwanted accidental switching OFF of the TRIAC is avoided.

7. The dimmer of claim 6, wherein the peak of the gate current pulse lasts for a period to maintain gate driving of the TRIAC until the TRIAC is fully switched ON.

8. The dimmer of claim 7, wherein the peak of the gate current pulse is independent of line voltage.

9. The dimmer of claim 1, wherein current from the capacitor continues to flow to the gate of the TRIAC until the capacitor is discharged.

10. The dimmer of claim 1, wherein the capacitor is discharged through the first and second MOSFETs, the TRIAC, and in parallel through the third resistor of the snubber circuit.

11. The dimmer of claim 1, wherein gate current pulse has a falling edge spanning over a second period such that unwanted accidental switching OFF of the TRIAC is avoided.

12. The dimmer of claim 1, wherein the bidirectional switch further comprises:

a fourth resistor electrically connected between the gate of the TRIAC and the first terminal of the TRIAC, the fourth resistor being structured to increase immunity against false triggering of the TRIAC.

13. A bidirectional switch for use in a dimmer structured to be placed between a power source and a load, the dimmer having a snubber circuit including a resistor and a capacitor connected to each other at a node, and a TRIAC including a gate, a first terminal structured to be connected to the load and the capacitor, and a second terminal structured to be connected to the power source, the bidirectional switch comprising:

a first MOSFET (metal-oxide-semiconductor field-effect transistor) having drain that is structured to be electrically connected to the node of the snubber circuit;

a first resistor having first and second ends, the first end structured to be electrically connected to source of the first MOSFET;

a second resistor having third and fourth ends, the third end structured to be electrically connected to the first end of the first resistor; and a second MOSFET having source that is structured to be electrically connected to the fourth end of the second resistor and drain that is structured to be electrically connected to the gate of the TRIAC, wherein the bidirectional switch is structured to transmit a gate current pulse signal to the gate of the TRIAC to switch the TRIAC between an OFF phase and an ON phase, wherein the gate current is determined only by parameters of the first and second MOSFETs and values of the first and second resistors.

14. The bidirectional switch of claim 13, wherein the drain of the first MOSFET is structured to be directly connected to the node of the snubber circuit, and not connected to a line conductor coupled to the power source.

15. The bidirectional switch of claim 13, wherein upon turning ON the first MOSFET and the second MOSFET, current flows to the gate of the TRIAC from the capacitor of the snubber circuit via the first MOSFET and the second MOSFET and the capacitor acts as an energy source to the TRIAC during the switching ON of the TRIAC.

16. The bidirectional switch of claim 13, wherein the first resistor and the second resistor are structured to limit the current flowing to the gate of the TRIAC upon turning ON the first MOSFET and the second MOSFET.

17. The bidirectional switch of claim 13, wherein upon turning ON the first MOSFET and the second MOSFET, gate current pulse rises to a peak, and wherein the gate current pulse remains constant during switching ON of the TRIAC such that an unwanted accidental switching OFF of the TRIAC is prevented.

18. The bidirectional switch of claim 17, wherein the peak of the gate current pulse lasts for a period to maintain gate driving of the TRIAC until the TRIAC is fully switched ON.

19. The bidirectional switch of claim 17, wherein the peak of the gate current pulse is independent of line voltage.

* * * * *